(12) United States Patent
Pasotti et al.

(10) Patent No.: US 6,400,607 B1
(45) Date of Patent: Jun. 4, 2002

(54) READING CIRCUIT FOR A NON-VOLATILE MEMORY

(75) Inventors: Marco Pasotti, S. Martino Siccomario; Giovanni Guaitini, Trecella; Pier Luigi Rolandi, Monleale; Guido De Sandre, Brugherio, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/699,304

(22) Filed: Oct. 27, 2000

(30) Foreign Application Priority Data

Oct. 29, 1999 (IT) .......................................... TO99A0943

(51) Int. Cl.[7] .............................................. G11C 16/06
(52) U.S. Cl. .............................. 365/185.21; 365/185.2; 365/189.07
(58) Field of Search .......................... 365/185.21, 185.2, 365/185.23, 210, 185.25, 189.07, 202, 203

(56) References Cited

U.S. PATENT DOCUMENTS

| | | | |
|---|---|---|---|
| 5,559,737 A | * 9/1996 | Tanaka et al. | 365/185.25 |
| 5,563,826 A | * 10/1996 | Pascucci et al. | 365/185.21 |
| 5,729,492 A | * 3/1998 | Campardo | 365/185.21 |
| 5,864,513 A | * 1/1999 | Pascucci | 364/210 |
| 6,219,290 B1 | * 4/2001 | Chang et al. | 365/207 |

* cited by examiner

Primary Examiner—David Nelms
Assistant Examiner—Gene N. Auduong
(74) Attorney, Agent, or Firm—Lisa K. Jorgenson; Robert Iannucci; SEED IP Law Group PLLC

(57) ABSTRACT

A reading circuit having an array branch connected to a multi-level array memory cell; a reference branch connected to a reference memory cell; a current/voltage converter stage formed of a current mirror having a variable mirror ratio, connected to the array and reference branches, and supplying at an array node and at a reference node respectively an array potential and a reference potential, which are correlated respectively to the currents flowing in the array branch and in the reference branch; and a comparator stage having a first and a second input connected to the array and reference nodes for comparing with one another the array and reference potentials.

20 Claims, 3 Drawing Sheets

READING CIRCUIT FOR A NON-VOLATILE MEMORY

TECHNICAL FIELD

The present invention relates to a reading circuit for a non-volatile memory.

BACKGROUND OF THE INVENTION

As is known, in a floating gate non-volatile memory cell storage of a logic state is carried out by programming the threshold voltage of the cell itself through the definition of the quantity of electrical charge stored in the floating gate region.

Reading of a memory cell is carried out using a read circuit known as "sense amplifier", which, in addition to recognizing the logic state stored in the memory cell, also provides for the correct biasing of the drain terminal of the memory cell.

FIG. 1 illustrates by way of example a known sense amplifier used to read multi-level flash memory cells.

The sense amplifier, indicated as a whole by 1, is a successive approximation sense amplifier comprising a supply line 2 set to a supply voltage $V_{CC}$; a ground line 4 set to a ground voltage $V_{GND}$; an array branch connected via an array bit line 8 to a non-volatile memory cell 10, the content of which is to be read; a reference branch 12 connected via a reference bit line 14 to a digital/analog converter (DAC) 16, which draws at an output a reference current $I_R$; a current/voltage converter stage 18 connected to the array and reference branches 6, 12 for converting the currents flowing in these branches respectively into an array potential $V_M$ and a reference potential $V_R$; a differential comparator stage 20 for comparing the array and reference potentials $V_M$ and $V_R$, and supplying at an output a logic comparison signal COMP indicative of the result of the comparison; and an n-bit successive approximation register (SAR) 22, wherein n is the number of bits stored in the memory cell 10, having an input connected to the output of the comparator stage 20, and a plurality n of outputs connected to respective inputs of the digital/analogue converter 16, for driving the digital/analogue converter 16 in order to vary the reference current $I_R$ drawn by the latter at the output, in the manner described in detail hereinafter.

In the example illustrated, the memory cell 10 to be read is a multi-level cell in which four bits (sixteen levels) are stored, and has a gate terminal receiving a reading signal $V_{READ}$, a drain terminal connected to the array bit line 8, and a source terminal connected to the ground line 4.

In the example illustrated, the successive approximation register 22 is consequently a four-bit register, and has four outputs, each of which is associated with a respective bit, and at which it supplies four control signals, indicated as B3, B2, B1 and B0, assuming a logic value correlated to the logic value assumed by the corresponding bit.

The array branch 6 comprises an array biasing stage 24 for biasing the drain terminal of the memory cell 10 to a predetermined potential, typically 1 V. In particular, the array biasing stage 24 has a negatively fedback cascode structure formed of an NMOS transistor 26 and a logic inverter 28; the NMOS transistor 26 has a drain terminal connected to the current/voltage converter stage 18, a source terminal connected to the array bit line 8 and to the input terminal of the logic inverter 28, and a gate terminal connected to the output terminal of the logic inverter 28. With this configuration, the electrical potential of the drain terminal of the memory cell 10 is approximately equivalent to the threshold voltage of the logic inverter 28, at which potential, in other words, the logic inverter 28 switches from one logic level to the other.

The reference branch 12 comprises a reference biasing stage 30 altogether identical to the array biasing stage 24, and having a fed-back cascode structure formed of an NMOS transistor 32 and a logic inverter 34; the NMOS transistor 32 has a drain terminal connected to the current/voltage converter stage 18, a source terminal connected to the reference bit line 14 and to the input terminal of the logic inverter 34, and a gate terminal connected to the output terminal of the logic inverter 34.

The current/voltage converter stage 18 is formed of a current mirror comprising a first diode-connected PMOS transistor 36 arranged on the array branch 6, and a second PMOS transistor 38 arranged on the reference branch 12; in particular, the PMOS transistors 36 and 38 have gate terminals connected to one another and to the drain terminal of the first PMOS transistor 36, source terminals connected to the supply line 2, and drain terminals connected to the drain terminals respectively of the NMOS transistor 26 and the NMOS transistor 32, and defining respectively an array node 40 and a reference node 42, at which the aforementioned array potential $V_M$ and reference potential $V_R$, respectively, are present and to which the two input terminals of the comparator stage 20 are connected.

The sense amplifier 1 operates as follows. When a constant reading voltage $V_{READ}$, having a value greater than the highest threshold voltage which can be programmed in the memory cell 10, is applied to the gate terminal of the memory cell 10, and provided that the drain terminal of the memory cell 10 is kept at a sufficiently low, constant value of approximately 1 V, the memory cell 10 works in the triode operating area, and draws an array current $I_M$ which is inversely proportional to the threshold voltage programmed, i.e., the higher its threshold voltage, the lower the current flowing in it.

The array current $I_M$ is mirrored onto the reference node 42 by the PMOS transistors 36 and 38 of the current mirror 18, and in the reference node 42 the reference current $I_R$ drawn by the digital/analogue converter 16 is subtracted from this mirrored current.

The array potential $V_M$ and the reference potential $V_R$ of the array node 40 and the reference node 42, respectively, are thus correlated respectively to the array current $I_M$, and to the difference between the reference current $I_R$ and the array current $I_M$ mirrored onto the reference branch 12, and these potentials are compared with one another by the comparator stage 20, which supplies at an output the comparison signal COMP, which assumes a first high logic level if $V_M$ is greater than $V_R$, and a second, low logic level if $V_M$ is smaller than $V_R$.

The comparison signal COMP is then supplied to the successive approximation register 22, which, on the basis of the logic level of this signal, modifies the logic level of the control signals B3-B0, by implementing a dichotomous algorithm, which is known and therefore described only briefly hereinafter.

In particular, the successive approximation register 20 controls the digital/analogue converter 16 such as to vary by steps the reference current $I_R$ drawn by the converter, on the basis of the logic level assumed by the comparison signal COMP. In detail, as soon as the gate terminal of the memory cell 10 is supplied with the reading signal $V_{READ}$, the successive approximation register 22 is controlled such as to set the control signal B3 to the high logic level (most significant bit set to "1"). Consequently, the digital/analogue converter 16 draws a reference current $I_R$ having a value equivalent to half the maximum value which it can supply (i.e., a value correlated to the weight of the most significant bit which has been set to "1"), and this current begins to flow in the reference branch 12.

If the reference current $I_R$ is lower than the array current $I_M$ mirrored onto the reference branch 12, the potential $V_R$ varies towards values which are greater than the array potential $V_M$, and the logic level which is consequently assumed by the comparison signal COMP controls the successive approximation register 22 such as to set the control signal B2 also to the high logic level (second most significant bit set to "1"), whereas if the reference current $I_R$ is greater than the array current $I_M$ mirrored onto the reference branch 12, the potential $V_R$ varies towards values which are lower than the array potential $V_M$, and the logic level which is consequently assumed by the comparison signal COMP controls the successive approximation register 22 such as to set the control signal B3 to the low logic level (most significant bit set to "0"), and the control signal B2 to the high logic level (second most significant bit set to "1").

In the first case, the reference current $I_R$ drawn by the digital/analogue converter 16 is consequently incremented by a value equivalent to a quarter of the maximum value which can be supplied (i.e., by a value correlated to the weight of the second most significant bit which has been set to "1"), and thus in total it assumes a value equivalent to three quarters of the maximum current which can be supplied, whereas in the second case the reference current $I_R$ drawn by the digital/analogue converter 16 assumes a value equivalent to one quarter of the maximum value which can be supplied.

The comparison is then carried out once more between the new values assumed by the array and reference potentials $V_M$ and $V_R$, and consequently the logic levels of the control signal B3-B0 are modified, and by proceeding in this manner with successive approximations, at each comparison step there is determination of the value of one of the four bits stored in the memory cell 10 (dichotomous algorithm), and therefore the four bits stored in the memory cell 10 are written in four steps into the successive approximation register 20.

The main disadvantage of the known sense amplifiers is their high current consumption, particularly in cases when the memory cell to be read is blank, or has a low threshold voltage. In fact, in these cases, the high reading voltage $V_{READ}$ supplied to the gate terminal of the memory cell to be read, together with the low threshold voltage of the memory cell, causes the current flowing in the memory cell itself to assume a rather high value, approximately 50 $\mu$A, which, when multiplied by the number of sense amplifiers which generally operate simultaneously in order to carry out parallel reading of several memory cells, gives rise to an overall consumption which in some applications can be unacceptable.

In addition, a further disadvantage of the known sense amplifiers is to have a reading time which increases substantially when the array and reference current $I_R$ and $I_M$ assume similar values; in fact in these operating conditions, the variation of the array potential $V_M$ is somewhat slow, and it is therefore necessary to wait for a relatively long time before being able to enable the comparator stage 20, and thus to have available the content of the memory cell.

The considerations described above for successive approximation sense amplifiers dedicated to the reading of multi-level memory cells, also apply equally well to sense amplifiers dedicated to reading of flash memory cells, in which a single bit is stored, and in which the reference current $I_R$ is constant and generated by means of a reference memory cell having a known content.

SUMMARY OF THE INVENTION

An embodiment of the present invention is to provide a reading circuit having a lower current consumption than that of reading circuits according to the known prior art.

The reading circuit advantageously also has a reading time which is substantially the same in all operating conditions.

The present invention overcomes the limitations of the prior art by providing a reading circuit for a nonvolatile memory. The reading circuit includes a first reference voltage, a multilevel array memory cell coupled to receive the first memory reference voltage, an array branch coupled to the multilevel array memory cell and a reference branch coupled to a current generator. The current generator includes a reference memory cell which is connected to a second reference voltage. A current voltage converter is coupled to both the array and reference branches. According to one aspect of the invention, the current voltage converter includes a reference line set to a reference potential and also includes a first diode-connected transistor having a first terminal connected to the reference line. The current voltage converter also includes a second terminal connected to the reference node, and a control terminal connected to the second terminal of the first transistor. The current voltage converter also includes several additional transistors. Preferably the number of additional second transistors is equal or equivalent to the number of bits stored in the array memory cell. The second transistors each have a control terminal interconnected to the control terminals of the other transistors and to the control terminal of the first transistor. Each of the second transistors also has a first terminal connected to the reference line, and also has second terminals coupled to receive respective control signals at its control terminal; a control signal is supplied by a successive approximation register. The current voltage converter supplies an array potential which is correlated to a current flowing in the array branch. The array potential is supplied at an array node. The current voltage converter also supplies a reference potential correlated to a current flowing in the reference branch. The reference potential is supplied at a reference node. The reading circuit also includes an equalization transistor which includes drain and source terminals respectively connected to the array node and the reference node. The reading circuit also includes a comparator that has a first input coupled to the array node and a second input coupled to the reference node. The successive approximation register has an input coupled to the output of the comparator. The successive approximation register provides a plurality of outputs that supply the control signals.

According to other aspects of the invention, various alternative embodiments are provided that similarly provide a reading circuit with a lower current consumption than that of reading circuits according to the known prior art.

BRIEF DESCRIPTION OF THE DRAWINGS

In order to assist understanding of the present invention, four preferred embodiments are now described, purely by way of non-limiting example, and with reference to the attached drawings, in which.

DETAILED DESCRIPTION OF THE INVENTION

Figure 1:
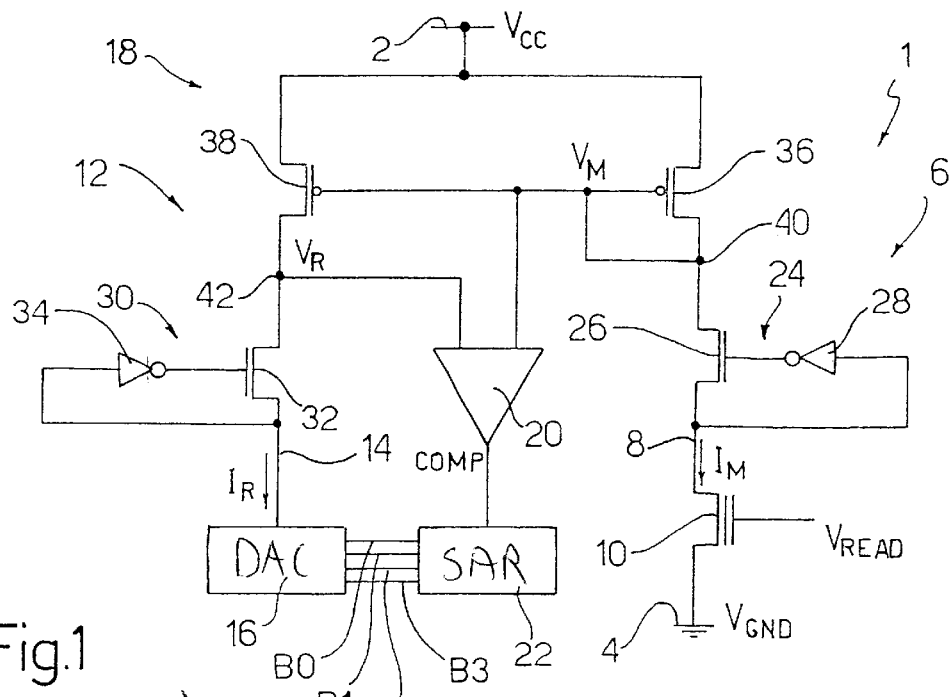
FIG. 1 shows a sense amplifier according to the known prior art.
Figure 2:
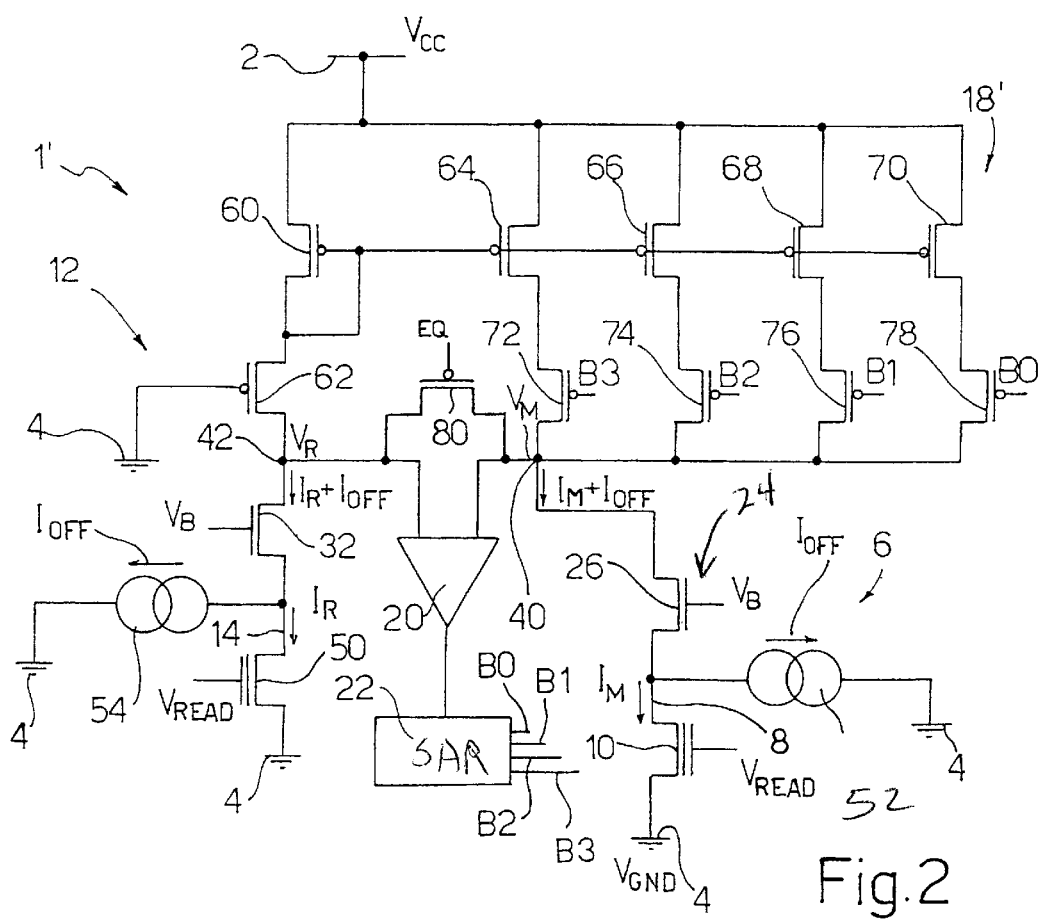
FIG. 2 shows a sense amplifier according to a first embodiment of the present invention.

FIG. 2 illustrates a sense amplifier according to a first embodiment of the present invention.

The sense amplifier, indicated as a whole by 1', has a circuit structure similar to that of the sense amplifier 1 previously described, such that parts which are identical will be indicated with the same reference numbers.

The sense amplifier 1' differs from the sense amplifier 1 in that the digital/analogue converter 16 has been eliminated and the reference current $I_R$ is constant, and is generated by a non-volatile memory cell 50 having a known content, a drain terminal connected to the reference bit line 14, a source terminal connected to the ground line 4, and a gate terminal receiving the reading voltage $V_{READ}$.

In addition, the logic inverters 28, 34 have been eliminated, and the gate terminals of the NMOS transistors 26, 32 are supplied with the same reference voltage VB, which is low enough to keep the array memory cell 10 and the reference memory cell 50 in the triode functioning area.

The sense amplifier 1' also differs from the sense amplifier 1 in that it comprises an array branch 6 having a first current generator 52, connected between the drain terminal of the array memory cell 10 and the ground line 4, and supplying an offset current $I_{OFF}$; and a second current generator 54, connected between the drain terminal of the reference memory cell 50 and the ground line 4, and supplying the offset current $I_{OFF}$.

The offset currents $I_{OFF}$ supplied by the current generators 52, 54 are added to the array and reference currents $I_M$, $I_R$, and since they are the same as one another, they do not contribute to the comparison; the only function of the offset currents $I_{OFF}$ consists of keeping the flow of current in the sense amplifier 1' at acceptable values during the reading phase of the memory cell 10, even if the latter has a threshold voltage which is high enough to be switched off.

The sense amplifier 1' also differs from the sense amplifier 1 in that the current/voltage converter stage, indicated as 18', consists of a current mirror having a mirror ratio which varies according to the logic levels assumed by the control signals B3-B0, and comprising a first diode-connected PMOS transistor 60 arranged on the reference branch 12, and a second, a third, a fourth and a fifth PMOS transistor 64, 66, 68, 70, arranged on the current/voltage converter stage 18'. In particular, the PMOS transistor 60 has a source terminal connected to the supply line 2, a drain terminal connected to the reference node 42 via a PMOS transistor 62, and a gate terminal connected to its own drain terminal and to the gate terminals of the PMOS transistors 64, 66, 68, 70, which in turn have source terminals connected to the supply line 2, and drain terminals connected to the array node 40, via respective PMOS transistors 72, 74, 76, 78.

In particular, the PMOS transistor 62 has a source terminal connected to the drain terminal of the PMOS transistor 60, a drain terminal connected to the reference node 42, and a gate terminal connected to the ground line 4, whereas each of the PMOS transistors 72, 74, 76, 78 has a source terminal connected to the drain terminal of the respective PMOS transistor 64, 66, 68, 70, a drain terminal connected to the array node 40, and a gate terminal receiving a respective control signal B3, B2, B1, B0 supplied by the successive approximation register 22.

Each of the PMOS transistors 72, 74, 76, 78 operates as a closed switch when the corresponding control signal B3-B0 assumes a low logic level, and as an open switch when the corresponding control signal B3-B0 assumes a high logic level, whereas the PMOS transistor 62, which has its gate terminal connected to the ground line 4, is on the other hand continually switched on, and its function is to make the circuit structure of the reference branch 12 symmetrical relative to that of the array branch 6.

The PMOS transistors 60, 64, 66, 68, 70 have W/L values which are correlated to one another and can be selected according to two different criteria which allow to obtain different modes of operation of the current mirror 18'.

In particular, according to the first selection criterion, if a reference W/L value is indicated as S0, the PMOS transistors 60, 64, 66, 68, 70 have the following W/L values: $(W/L)_{60}=15*S0$, $(W/L)_{64}=8*S0$, $(W/L)_{66}=4*S0$, $(W/L)_{68}=2*S0$ and $(W/L)_{70}=S0$, thus determining operation of the current mirror 18' as a current divider, whereas, according to the second selection criterion, the PMOS transistors 60, 64, 66, 68, 70 have respectively the following W/L values: $(W/L)_{60}=S0$, $(W/L)_{64}=8*S0$, $(W/L)_{66}=4*S0$, $(W/L)_{68}=2*S0$ and $(W/L)_{70}=S0$, thus determining operation of the current mirror 18' as a current multiplier.

The mirror ratios deriving from use of the first selection criterion allow to use small values of the reference current $I_R$, with consequent reduction of energy consumption in the reference branch 12, whereas the mirror ratios deriving from use of the second selection criterion allow to obtain greater accuracy of reading, since the minimum array current $I_M$ is multiplied instead of divided, and is consequently less subject to undesirable disturbances.

Finally, the sense amplifier 1' comprises a PMOS equalization transistor 80 having drain and source terminals respectively connected to the array node 40 and to the reference node 42, and a gate terminal receiving an equalization signal EQ.

The main difference between the operation of the sense amplifier 1 and that of the sense amplifier 1' consists in the fact that in the latter the reference current $I_R$ is constant and the value contained in the successive approximation register 22 is used to modify the mirror ratio of the current mirror 18', such as to vary the current injected into the array node 40, and obtained by mirroring the reference current $I_R$ onto the array branch.

By means of the above-described circuit structure, depending on the logic levels of the control signals B0-B3 supplied by the successive approximation register 22, it is possible to inject into the array node 40 a current which is variable between a minimum value equivalent to zero and a maximum value equivalent to $I_R$, if the W/L values of the PMOS transistors 60, 64, 66, 68, 70 are selected according to the first criterion (divider current mirror), or between a minimum value equivalent to zero and a maximum value equivalent to $15*I_R$, if the W/L values of the PMOS transistors 60, 64, 66, 68, 70 are selected according to the second criterion (multiplier current mirror).

The sense amplifier 1' operates as follows. Initially, the equalization signal EQ is set to the low logic level, and thus the PMOS transistor 80 is switched on, and connects to one another the array and reference nodes 40, 42, therefore making their potentials assume substantially the same value.

On completion of the equalization of the array and reference nodes 40, 42, the equalization signal EQ is set to the high logic level, such as to separate electrically from one another the array and reference nodes 40, 42.

The reading voltage $V_{READ}$, which is typically 5.5 or 6 V, is then applied to the gate terminals of the memory cells 10, 50, and the successive approximation register 22 is controlled such as to set the control signal B3 to the low logic level and the control signals B2-B0 to the high logic level; by this means the PMOS transistor 72 is switched on, whereas the PMOS transistors 74–78 are switched off.

In this situation, the PMOS transistor 64 is therefore electrically connected to the array node 40, whereas the other PMOS transistors 66-70 are electrically disconnected from the array node 40.

The PMOS transistor 64 then injects into the array node 40 a current which is equivalent to $8/15*I_R$ (ratio between the W/L values of the PMOS transistors 60 and 64), if the W/L values of the PMOS transistors 60 and 64 have been selected according to the first aforementioned criterion, whereas it is equivalent to $8*I_R$, if the W/L values of the PMOS transistors 60 and 64 have been selected according to the second aforementioned criterion.

If the current injected by the PMOS transistor 64 into the array node 40 is lower than the array current $I_M$, the array potential $V_M$ tends to assume values lower than those assumed by the reference potential $V_R$, and the logic level consequently assumed by the comparison signal COMP controls the successive approximation register 22, such as to set the control signal B2 also to the low logic level, whereas if the current injected by the PMOS transistor 64 into the array node 40 is greater than the array current $I_M$, the array potential $V_M$ tends to assume values which are higher than those assumed by the reference potential $V_R$, and the logic level consequently assumed by the comparison signal COMP controls the successive approximation register 22 such as to set the control signal B3 to the high logic level, and the control signal B2 to the low logic level.

In the first case, both the PMOS transistor 72 and the PMOS transistor 74 are switched on, and thus both the PMOS transistor 64 and the PMOS transistor 66 are electrically connected to the array node 40, whereas in the second case, only the PMOS transistor 74 is switched on, and therefore only the PMOS transistor 66 is electrically connected to the array node 40.

In both cases, the PMOS transistor 66 injects into the array node 40 a current which is equivalent to $4/15*I_R$ (ratio between the W/L values of the PMOS transistors 60 and 66) if the W/L values of the PMOS transistors 60 and 66 have been selected according to the first aforementioned criterion, or equivalent to $4*I_R$ if the W/L values of the PMOS transistors 60 and 66 have been selected according to the second aforementioned criterion, which current in the first case is added to the current injected by the PMOS transistor 64.

The comparison is then carried out once more between the new values of array and reference potentials $V_M$ and $V_R$, and the logic levels of the control signals B3-B0 are consequently modified, and by proceeding in this manner with successive approximations, at each comparison step there is determination of the value of one of the four bits stored in the memory cell 10 (dichotomous algorithm), and therefore the four bits stored in the memory cell 10 are written in four steps into the successive approximation register 22.

The advantages of the sense amplifier 1' are as follows.

The structure shown in FIG. 2 allows firstly to save surface area on the silicon, since the space which is necessary for production of the above-described PMOS transistors and switches is smaller than that necessary for production of an entire digital/analogue converter, and secondly to obtain greater compactness of the circuit on the silicon, since the aforementioned PMOS transistors and switches can be produced directly on the array branch, instead of separately from the array and reference branches, which, on the other hand, is typically the case for a digital/analogue converter.

In addition, the increased compactness of the circuit which is obtained on the silicon permits a further energy saving compared with the conventional sense amplifiers, since the overall path which is followed by the current is shorter than that which it follows when the digital/analogue converter is produced separately, and this gives rise to a consequent lower power dissipation.

Figure 3:
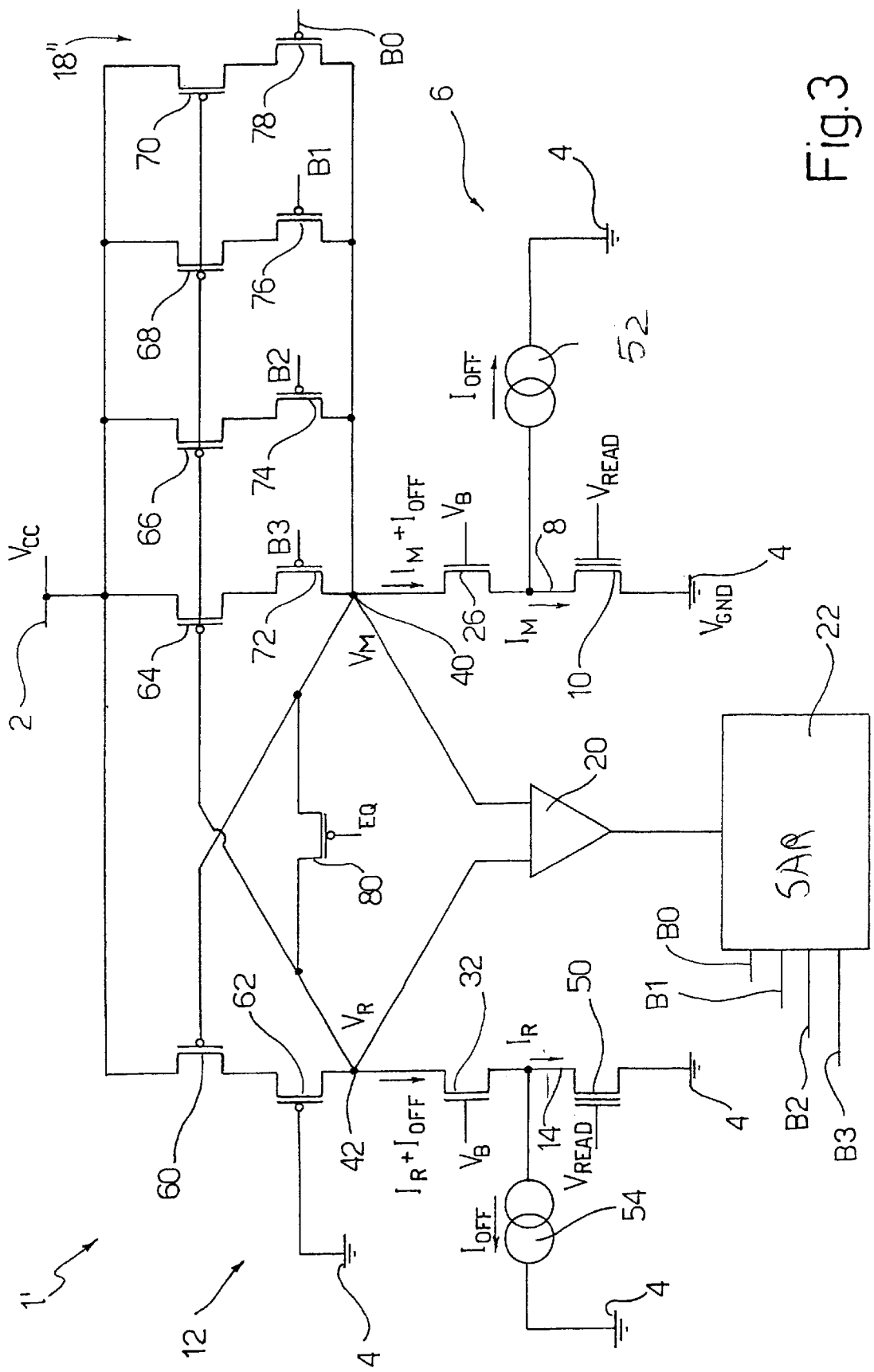
FIG. 3 shows a sense amplifier according to a second embodiment of the present invention.

FIG. 3 illustrates a sense amplifier according to a second embodiment of the present invention.

The sense amplifier, which is indicated as a whole by 1", has a circuit structure which is similar to that of the sense amplifier 1' previously described, such that identical parts will be indicated by the same reference numbers.

In particular, the sense amplifier 1" differs from the sense amplifier 1' in that the current mirror, indicated as 18", differs from the current mirror 18' in that it has a positive feedback. In particular, the PMOS transistor 60 is no longer diode-connected and has a gate terminal connected to the array node 40, whereas the PMOS transistor 64 has a gate terminal connected to the reference node 42.

The operation of the sense amplifier 1" is altogether similar to that of the sense amplifier 1', concerning the dichotomous algorithm for reading the content of the memory cell 10, and therefore the description will not be repeated.

The main difference between the sense amplifier 1' and the sense amplifier 1" consists in the greater speed at which the content of the memory cell 10 is read.

In fact, the above-described connection of the gate terminals of the PMOS transistors 60 and 64 produces a positive reaction, which tends to amplify considerably and very quickly even the smallest difference which exists between the array potential $V_M$ and the reference potential $V_R$, until there is complete imbalance of the array and reference branches 6, 12 of the sense amplifier 1".

Let the case be considered, for example, in which only the PMOS transistors 60 and 64 are involved in the current/voltage conversion operation. In this case, if the array potential $V_M$ is even slightly lower than the reference potential $V_R$, the PMOS transistor 60 will conduct a current which is slightly greater than that which is conducted by the PMOS transistor 64, and this will cause the reference potential $V_R$ to tend to increase further, and the array potential VM to tend to decrease further, thus triggering a regenerative mechanism which would very quickly lead to complete imbalance of the array and reference branches 6, 12.

This increased speed of variation of the array and reference potentials $V_M$ and $V_R$, together with the fact that in general the comparator stage 20 does not require large differences of potential between its input terminals in order to vary towards a condition of imbalance, causes the moment at which it is possible to enable the comparator stage 20 to depend relatively little on the difference between these currents, thus making the overall reading time approximately similar in all the operating conditions.

In addition, since, in order to carry out the comparison, it is not necessary that the array and reference potentials $V_M$ and $V_R$ vary substantially, these potentials can also be equalized far more quickly.

A further consequence of the increased speed of reading consists in the fact the currents generated during the reading flow in the circuit for shorter periods of time than those of the sense amplifiers which do not have positive feedback on the current mirror 18", thus contributing further towards saving current.

Finally, it is apparent that modifications and variants can be made to the sense amplifiers 1', 1" described and illustrated here, without departing from the protective scope of the present invention defined by the attached claims.

Figure 4:
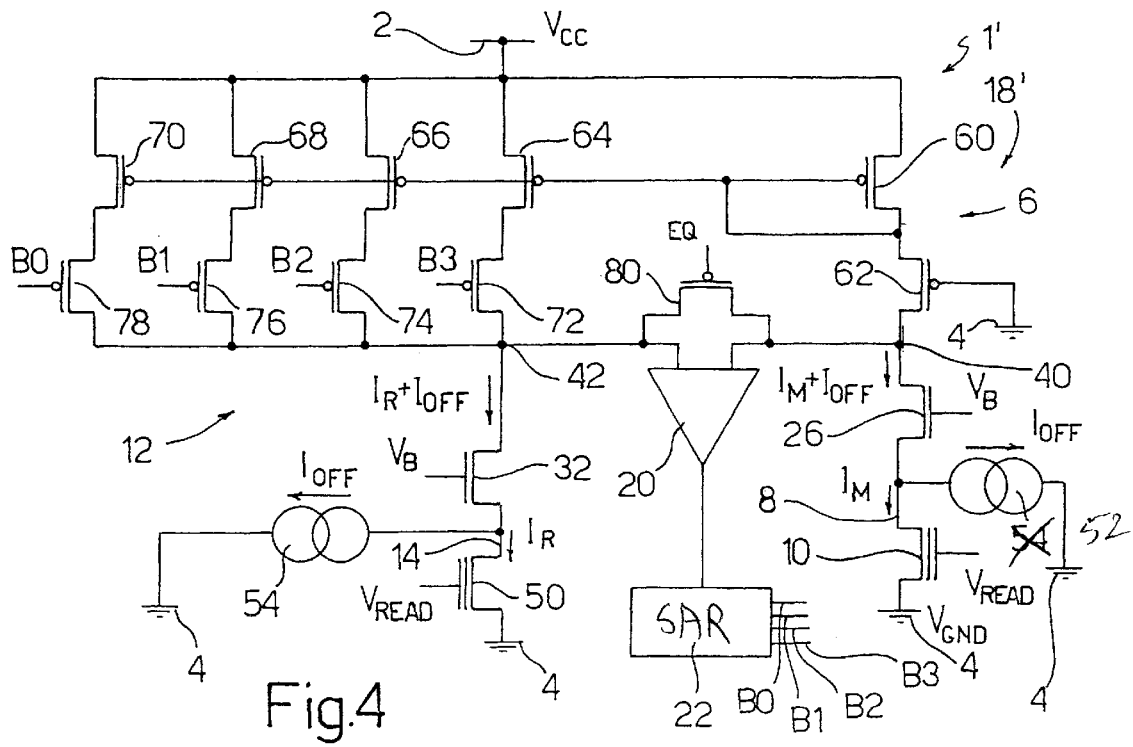
FIG. 4 shows a sense amplifier according to a third embodiment of the present invention.
Figure 5:
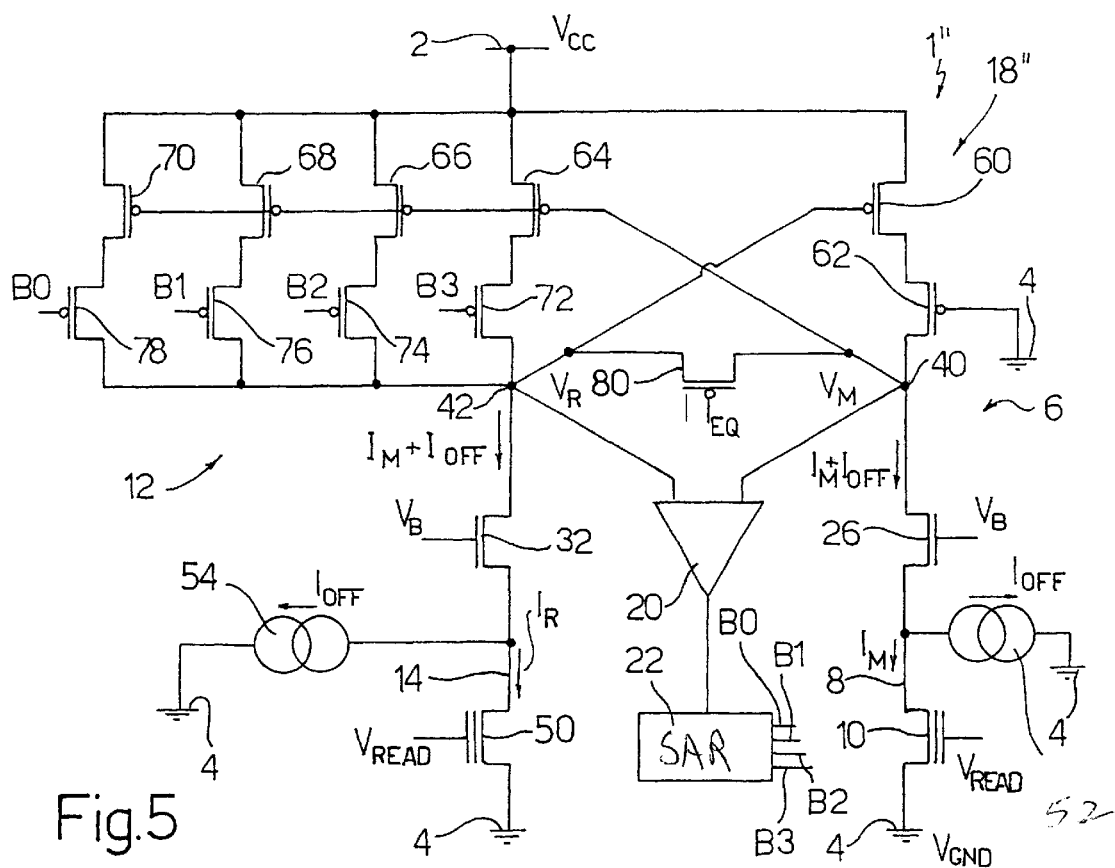
FIG. 5 shows a sense amplifier according to a fourth embodiment of the present invention.

For example, the circuit configuration of the current mirrors 18', 18" could be inverted in comparison with those described and illustrated in FIGS. 2 and 3, as shown in FIGS. 4 and 5, in which the various parts are indicated with the same reference numbers as those used in FIGS. 2 and 3, i.e., the PMOS transistors 60 and 62 could be arranged on the array branch 6, and connected between the supply line 2 and the array node 40, and the PMOS transistors 64–70 and 72–78 could be arranged on the reference branch 12, and connected between the supply line 2 and the reference node 42. In this case, it will therefore be the array current $I_M$ which is mirrored on the reference branch 12, in accordance with a mirror ratio which is variable according to which PMOS transistors 72–78 are switched on.

What is claimed is:

1. Reading circuit for a non-volatile memory, comprising:
   an array branch connected to a multi-level array memory cell;
   a reference branch connected to a current generator;
   a current/voltage converter connected to said array and reference branches, and supplying at an array node and to a reference node respectively an array potential and a reference potential correlated respectively to currents flowing in the array branch and in the reference branch;
   a comparator having a first and a second input connected to the array and reference nodes for comparing with one another said array and reference potentials; and
   wherein said current generator includes a reference memory cell, and said current/voltage converter includes a current mirror connected to said array and reference nodes and having a variable mirror ratio.

2. Reading circuit according to claim 1, wherein said current mirror comprises a reference line set to a reference potential; and
   further comprising: a first diode-connected transistor having a first terminal connected to said reference line, a second terminal connected to said reference node, and a control terminal connected to the second terminal of the first transistor; and
   a plurality of second transistors of a number equivalent to the number n of bits stored in said array memory cell, having control terminals connected to one another and to said control terminal of said first transistor, first terminals connected to said reference line, and second terminals connected to said array node via respective switches receiving respective control signals at said control terminals.

3. Reading circuit according to claim 2 wherein said switches further comprise respective third transistors.

4. Reading circuit according to claim 2, further comprising a successive approximation register having an input connected to an output of said comparator, and a plurality of outputs coupled to said control terminals.

5. Reading circuit according to claim 1, wherein said current mirror comprises a reference line set to a reference potential;
   further comprising:
   a first transistor having a first terminal connected to said reference line, a second terminal connected to said array node, and a control terminal connected to the second terminal of the first transistor; and
   a plurality of second transistors of a number equivalent to the number n of bits stored in said array memory cell, having control terminals connected to one another and to said control terminal of said first transistor, first terminals connected to said reference line, and second terminals connected to said reference node via respective switches receiving respective control signals at control terminals.

6. Reading circuit according to claim 5 wherein said switches comprise respectively a plurality of third transistors.

7. Reading circuit according to claim 5, further comprising a successive approximation register having an input connected to an output of said comparator, and a plurality of outputs coupled to said control terminals.

8. Reading circuit according to claim 1 wherein said current mirror further comprises a reference line set to a reference potential; and
   further comprising: a first transistor having a first terminal connected to said reference line, a second terminal connected to said reference node, and a control terminal connected to said array node; and
   a plurality of second transistors of a number equivalent to the number n of bits stored in said array memory cell, having control terminals connected to one another and to said reference node, first terminals connected to said reference line; and second terminals connected to said array node via respective switches receiving respective control signals at control terminals.

9. Reading circuit according to claim 8 wherein said switches comprise respective transistors.

10. Reading circuit according to claim 8, further comprising a successive approximation register having an input connected to an output of said comparator, and a plurality of outputs coupled to said control terminals.

11. Reading circuit according to claim 1 wherein said current mirror further comprises:
    a reference line set to a reference potential;
    first transistor having a first terminal connected to said reference line, a second terminal connected to said array node, and a control terminal connected to said reference node; and
    a plurality of second transistors of a number equivalent to the number of bits stored in said array memory cell, having control terminals connected to one another and to said array node, first terminals connected to said reference line, and second terminals connected to said reference node via respective switches receiving respective control signals at control terminals.

12. Reading circuit according to claim 11 wherein said switches comprise respective third transistors.

13. Reading circuit according to claim 11, further comprising a successive approximation register having an input connected to an output of said comparator, and a plurality of outputs coupled to said control terminals.

14. A reading circuit for a non-volatile memory, the reading circuit comprising:
- an array branch coupled to a multi-level array memory cell, storing a number of bits, which is connected to a first reference voltage;
- a reference branch coupled to a current generator;
- a current mirror coupled to said array and reference branches, said current mirror both supplying at an array node an array potential as a function of current flowing in said array branch and supplying at a reference node a reference potential as a function of current flowing in said reference branch, wherein said reference potential is proportional to said number of bits stored in said multi-level array memory cell;
- a comparator having first and second inputs coupled respectively to said array and reference nodes; and
- an equalization transistor having drain and source terminals respectively connected to said array node and to said reference node.

15. The reading circuit recited in claim 14, wherein said current mirror is coupled to a reference potential and comprises:
- a first diode-connected transistor having a first terminal coupled to said reference potential, a second terminal coupled to said reference node, and a third terminal coupled to said second terminal of said first transistor; and
- a plurality of second transistors having control terminals interconnected with said control terminal of said first transistor, first terminals connected to said reference potential, and second terminals connected to said array node via respective switches responsive to respective control signals.

16. The reading circuit recited in claim 15, further comprising a successive approximation register having an input coupled to an output of said comparator and a plurality of outputs supplying said control signals.

17. The reading circuit recited in claim 16, further comprises a plurality of third transistors each having a drain terminal coupled to said array node, a source terminal coupled to said reference node, and a gate terminal coupled to receive an equalization signal.

18. The reading circuit recited in claim 17, wherein each said second transistor further comprises a selectable W/L value.

19. The reading circuit recited in claim 18, wherein said current mirror operates in a plurality of modes as a function of said W/L values of said second transistors.

20. A reading circuit for a non-volatile memory, the reading circuit comprising:
- a first reference voltage;
- a multi-level array memory cell coupled to receive said first reference voltage;
- an array branch coupled to said multi-level array memory cell;
- a reference branch coupled to a current generator, said current generator including a reference memory cell which is connected to a second reference voltage;
- a current/voltage converter coupled to said array and reference branches, said current/voltage converter having:
  - a reference line set to a reference potential,
  - a first diode-connected transistor having a first terminal connected to said reference line, a second terminal connected to said reference node, and a control terminal connected to the second terminal of the first transistor,
  - a plurality of second transistors of a number equal to the number n of bits stored in said array memory cell, said second transistor having control terminals interconnected to said control terminal of said first transistor, first terminals connected to said reference line, and second terminals coupled to receive respective control signals at control terminals via respective switches,
  said current/voltage converter both supplying at an array node an array potential correlated to a current flowing in said array branch and supplying at a reference node a reference potential correlated to a current flowing in said reference branch;
- an equalization transistor having drain and source terminals respectively connected to said array node and to said reference node;
- a comparator having first and second inputs coupled respectively to said array and reference nodes; and
- a successive approximation register having an input coupled to an output of said comparator, and a plurality of outputs supplying said control signals.

* * * * *